(12) United States Patent
Zhang

(10) Patent No.: US 11,901,699 B2
(45) Date of Patent: Feb. 13, 2024

(54) NARROW LINEWIDTH LASER

(71) Applicant: SUZHOU INSTITUTE OF NANO-TECH AND NANO-BIONICS (SINANO), CHINESE ACADEMY OF SCIENCES, Suzhou (CN)

(72) Inventor: Ruiying Zhang, Suzhou (CN)

(73) Assignee: SUZHOU INSTITUTE OF NANO-TECH AND NANO-BIONICS (SINANO), CHINESE ACADEMY OF SCIENCES, Suzhou (CN)

(*) Notice: Subject to any disclaimer, the term of this patent is extended or adjusted under 35 U.S.C. 154(b) by 0 days.

(21) Appl. No.: 17/928,934

(22) PCT Filed: Nov. 19, 2021

(86) PCT No.: PCT/CN2021/131821
§ 371 (c)(1),
(2) Date: Dec. 1, 2022

(87) PCT Pub. No.: WO2022/105883
PCT Pub. Date: May 27, 2022

(65) Prior Publication Data
US 2023/0261440 A1 Aug. 17, 2023

(30) Foreign Application Priority Data
Nov. 20, 2020 (CN) .......................... 202011316288.5

(51) Int. Cl.
H01S 5/0625 (2006.01)
G02F 1/21 (2006.01)
(Continued)

(52) U.S. Cl.
CPC .......... *H01S 5/06255* (2013.01); *G02F 1/212* (2021.01); *G02F 1/2252* (2013.01);
(Continued)

(58) Field of Classification Search
CPC ........ H01S 5/06255; H01S 5/026; H01S 5/12; H01S 5/141; H01S 5/142; H01S 5/125; G02F 1/212; G02F 1/2252
See application file for complete search history.

(56) References Cited

U.S. PATENT DOCUMENTS 7,649,384 B2 1/2010 Ho et al.
9,692,207 B2 6/2017 Fang et al.
(Continued)

FOREIGN PATENT DOCUMENTS

CN 86202829 U 6/1987
CN 2687911 Y 3/2005
(Continued)

OTHER PUBLICATIONS

Bin Liu, et al., Passive microring-resonator-coupled lasers, Applied Physics Letters, 2001, pp. 3561-3563, vol. 79, No. 22.
(Continued)

*Primary Examiner* — Yuanda Zhang
(74) *Attorney, Agent, or Firm* — Bayramoglu Law Offices LLC

(57) ABSTRACT

A narrow linewidth laser includes a passive ring resonant cavity, an FP resonant cavity, and a first gain region. The passive ring resonant cavity and the FP resonant cavity are combined to form an M-Z (Mach-Zehnder interference structure) compound external cavity structure, and the M-Z compound external cavity structure is at least used for providing wavelength selection and narrowing laser linewidth. The first gain region is provided on the outer side of the M-Z compound external cavity structure and is used for providing a gain for the whole laser. The narrow linewidth laser is simple in structure, high in side-mode suppression ratio, narrow in linewidth, and high in output power. By further integrating a PN junction region or MOS junction region, broadband and rapid tuning with low power con-
(Continued)

sumption can also be achieved, and tuning management is simple.

17 Claims, 8 Drawing Sheets

(51) Int. Cl.
*G02F 1/225* (2006.01)
*H01S 5/026* (2006.01)
*H01S 5/14* (2006.01)
*H01S 5/12* (2021.01)
*H01S 5/125* (2006.01)

(52) U.S. Cl.
CPC ............... *H01S 5/026* (2013.01); *H01S 5/12* (2013.01); *H01S 5/141* (2013.01); *H01S 5/142* (2013.01); *H01S 5/125* (2013.01)

(56) References Cited

U.S. PATENT DOCUMENTS

| | | | |
|---|---|---|---|
| 2002/0105998 A1* | 8/2002 | Ksendzov | H01S 5/1032 372/92 |
| 2003/0002548 A1 | 1/2003 | Boscha | |
| 2004/0062483 A1 | 4/2004 | Taghavi-Larigani et al. | |
| 2004/0165826 A1 | 8/2004 | Wessel et al. | |
| 2009/0092159 A1* | 4/2009 | Kato | H01S 5/026 372/20 |
| 2012/0068325 A1 | 3/2012 | Montez et al. | |
| 2014/0326858 A1 | 11/2014 | Heidrich et al. | |
| 2019/0273358 A1* | 9/2019 | Zhang | H01S 5/026 |
| 2022/0320825 A1* | 10/2022 | Moehrle | H01S 5/125 |

FOREIGN PATENT DOCUMENTS

| | | |
|---|---|---|
| CN | 1889313 A | 1/2007 |
| CN | 101521352 A | 9/2009 |
| CN | 101881917 A | 11/2010 |
| CN | 102035136 A | 4/2011 |
| CN | 202260110 U | 5/2012 |
| CN | 102931582 A | 2/2013 |
| CN | 103022864 A | 4/2013 |
| CN | 202917803 U | 5/2013 |
| CN | 103441423 A | 12/2013 |
| CN | 103594911 A | 2/2014 |
| CN | 103682979 A | 3/2014 |
| CN | 203690693 U | 7/2014 |
| CN | 104067464 A | 9/2014 |
| CN | 104092086 A | 10/2014 |
| CN | 104143757 A | 11/2014 |
| CN | 104300358 A | 1/2015 |
| CN | 104319623 A | 1/2015 |
| CN | 204243445 U | 4/2015 |
| CN | 108075354 A | 5/2018 |
| WO | 2018086618 A1 | 5/2018 |

OTHER PUBLICATIONS

Zhixi Bian, et al., InP-Based Passive Ring-Resonator-Coupled Lasers, IEEE Journal of Quantum Electronics, 2003, pp. 859-865, vol. 39, No. 7.

T. Matsumoto, et al., Narrow Spectral Linewidth Full Band Tunable Laser Based on Waveguide Ring Resonators with Low Power Consumption, OSA/OFC/NFOEC, 2010.

Ken Suzuki, et al., Wavelength Tunable Laser Diodes with Si-Wire Waveguide Ring Resonator Wavelength Filters, Proc. of SPIE, 2011, pp. 79431G-1-79431G-7, vol. 7943.

Keita Nemoto, et al., Narrow-Spectral-Linewidth Wavelength-Tunable Laser Diode with Si Wire Waveguide Ring Resonators, Applied Physics Express, 2012, pp. 082701-1-082701-3, vol. 5.

Naoki Kobayashi, et al., Silicon Photonic Hybrid Ring-Filter External Cavity Wavelength Tunable Lasers, Journal of Lightwave Technology, 2015, pp. 1241-1246, vol. 33, No. 6.

Tomohiro Kita, et al., Long external cavity Si photonic wavelength tunable laser diode, Japanese Journal of Applied Physics, 2014, pp. 04EG04-1-04EG04-4, vol. 53.

Tin Komljenovic, et al., Widely Tunable Narrow-Linewidth Monolithically Integrated External-Cavity Semiconductor Lasers, IEEE Journal of Selected Topics in Quantum Electronics, 2015, vol. 21, No. 6, 1501909.

Rui Tang, et al., Narrow-spectral-linewidth silicon photonic wavelength-tunable laser with highly asymmetric Mach-Zehnder interferometer, Optics Letters, 2015, pp. 1504-1507, vol. 40, No. 7.

Youwen Fan, et al., Optically Integrated InP—Si3N4 Hybrid Laser, IEEE Photonics Journal, 2016, vol. 8, No. 6, 1505111.

Youwen Fan, et al., 290 Hz intrinsic linewidth from an integrated optical chip-based widely tunable InP—Si3N4 hybrid laser, CLEO, 2017.

Brian Stern, et al., Compact narrow-linewidth integrated laser based on a low-loss silicon nitride ring resonator, Optics Letters, 2017, pp. 4541-4544, vol. 42, No. 21.

Konosuke Aoyama, et al., Compact narrow-linewidth optical negative feedback laser with Si optical filter, Applied Physics Express, 2018, pp. 112703-1-112703-4, vol. 11.

Hang Guan, et al., Widely-tunable, narrow-linewidth III-V/silicon hybrid external-cavity laser for coherent communication, Optics Express, 2018, pp. 7920-7933, vol. 26, No. 7.

Yu Li, et al., Tunable Self-Injected Fabry-Perot Laser Diode Coupled to an External High-Q Si3N4/SiO2 Microring Resonator, Journal of Lightwave Technology, 2018, pp. 3269-3274, vol. 36, No. 16.

S. Darmawan, et al., Phase engineering for ring enhanced Mach-Zehnder interferometers, Optics Express, 2005, pp. 4580-4588, vol. 13, No. 12.

\* cited by examiner

S1. Growing material structures such as a passive waveguide layer, a space layer, an active waveguide layer, a cladding layer and a contact layer

S2. Lithographying a basic pattern of a semiconductor laser on a surface of the material structure obtained in the step S1

S3. Defining the whole waveguide of the laser by dielectric film etching and semiconductor etching under the mask

S4. Performing another lithographying to distinguish active gain region parts SOA1-SOA3 from the passive waveguide part

S5. Etching a passive ring cavity and a FP resonant cavity based on the mask

S6. Depositing a dielectric film, and passivating the active waveguides SOA1-SOA3

S7. Lithographying the surfaces of SOA1-SOA3 and forming windows by RIE, defining P electrodes by lift-off, thinning, polishing, and evaporating N electrodes on backside of the wafer

S8. Alloying, cleaving and press-welding

FIG. 10B

| Contact layer | |
|---|---|
| Active cladding layer | Passive cladding layer |
| Active waveguide layer | Passive waveguide layer |
| Buffer layer | Buffer layer |
| Substrate | Substrate |

FIG. 10C

| Contact layer | |
|---|---|
| Cladding layer | |
| Active waveguide layer | |
| Space layer | Passive cladding layer |
| Passive waveguide layer | Passive waveguide layer |
| Substrate | Substrate |

FIG. 10D

NARROW LINEWIDTH LASER

CROSS REFERENCE TO THE RELATED APPLICATIONS

This application is the national phase entry of International Application No. PCT/CN2021/131821, filed on Nov. 19, 2021, which is based upon and claims priority to Chinese Patent Application No. 202011316288.5, filed on Nov. 20, 2020, the entire contents of which are incorporated herein by reference.

TECHNICAL FIELD

The present disclosure relates to a laser, and in particular to a narrow linewidth laser.

BACKGROUND

Narrow linewidth laser is a high-quality light source for information communication (sensing) due to its excellent coherence, so it is of high value. The narrow linewidth laser not only can be applied to frontier science research such as high-precision spectral measurement, quantum(atom) frequency standards and the like, but also is a core component of the coherent light communication, distributed optical fiber sensing, thus can be widely applied to the fields of high-capacity laser communication, optical fiber communication and high sensitivity coherent detection and the like. The core competitiveness of the broadband tunable narrow linewidth laser as the light source can be further enhanced by its feature of broadband tuning and narrow linewidth in the application field.

Due to the wide and attractive application prospect of the narrow linewidth laser, numerous researchers and investment organizations devote to study the narrow linewidth laser. The following configurations are one after another adopted: (1) a configuration assembled by semiconductor gain chip, bulk wavelength selection unit, and linewidth narrowing unit (CN86202829U, CN200320130968.3, CN200810082028.9, CN200910235585.4, CN201210258846.6, CN201310395264.7, CN201310535501.5, CN201310728387.8, CN201410482266.4, CN201410602303.0); (2) a configuration assembled by semiconductor gain chip and an optical fiber (CN200510079902, CN200910050715.7, CN201410386617.1, CN201220642467.2); (3) a configuration assembled by a semiconductor laser-pumped all-fiber laser (CN201120374776.1, CN201210535987.8, CN201410271316.4, CN201320784023.7, CN201420684717.8); (4) a configuration of a waveguide external-cavity semiconductor laser (U.S. Ser. Nos. 12/006,8325, 09/741,790, 13/249,753 and the like).

Compared with the above hybrid configurations of the narrow linewidth lasers, a monolithically integrated semiconductor laser is the favorite in various application fields due to its advantages of compact structure, small size, light weight, low energy consumption, high reliability and long lifetime. However, the traditional DFB or DBR laser has limited cavity length, although the wavelength is selected using a complex grating structure, the narrow linewidth is hard to be obtained, directly resulting in limitation on the application of the DFB or the DBR laser in the above fields.

In 2001, some researchers have proposed that a narrow linewidth laser can be achieved based on a weak-coupled single ring external cavity, however, due to loss in the ring is too large, a single ring external-cavity laser has never been realized (Appl. Phys. Lett., 79(22) 3561, (2001)). IEEE J. Quantum. Electron., 39(7), 859, (2003)). Hereafter, a plurality of research organizations achieve a waveguide external-cavity narrow linewidth semiconductor laser by transforming this thought (OSA/OFC/NFOEC2010/0ThQ5, Proc. of SPIE Vol. 7943, 79431G, (2011), Appl. Phys. Express, 5, 082701, (2012), J. Lightwave Tech. 3(6) 1241, (2015), Jap. J. Appl. Phys. 53, 04EG04, (2014), IEEE J. Sel. Top. Quantum Electron, 21(6), 1501909, (2015), Optics Lett., 40(7) 1504, (2015)), IEEE. P. J., Vol. 8, (6), 1505111, (2016), IEEE CLEO JTh5C.9, (2017), Optics Lett., Vol. 42, (21), 4541, (2017), Appl. Phys. Exp. 11, 112703(2018), Optics Exp., Vol. 26, (7), 7920, (2018), IEEE J. Lightw. Tech, Vol. 36, (16), 3269(2018). Although the laser has achieved the chip-level narrow linewidth performance, all lasers here are based on dielectric photonic integrated circuits serving as linewidth narrowing units and wavelength tuning units, III-V SOA serving as a gain region, the dielectric photonic integrated circuits and the III-V SOA are hybrid integrated to form the narrow linewidth tunable semiconductor laser. Moreover, due to the fact that these dielectric waveguide photonic integrated circuits acting as wavelength selection and tuning, and linewidth reduction units are particularly complex, refractive indexes of a plurality of resonant cavities usually need to be adjusted by the electro-optic or thermal-optic effect to obtain the optimal performance, such as broadband tuning range, narrow linewidth, and high side-mode-suppression-ratio, which results in the complex electrothermal management and slow tuning speed.

This applicant has also previously proposed a monolithically integrated narrow linewidth laser (PCT/CN2017/110792). However, these monolithically integrated narrow linewidth lasers cannot be employed in a corresponding information system due to their lower output power and lower side-mode-suppression ratio.

SUMMARY

An objective of the present disclosure is to provide a narrow linewidth laser to overcome the shortcomings in the prior art.

To achieve the objective, the present disclosure provides the following technical solutions:

A narrow linewidth laser is provided by some embodiments of the present disclosure, including a passive ring resonant cavity, an FP resonant cavity and a first gain region, wherein the passive ring resonant cavity and the FP resonant cavity are combined to form an M-Z (Mach-Zehnder interference structure) compound external cavity structure, the M-Z compound external cavity structure is at least used for providing wavelength selection and narrowing laser linewidth, and the first gain region is provided on the outer side of the M-Z compound external cavity structure and is at least used for providing a gain for the whole laser.

In some embodiments, the passive ring resonant cavity and the FP resonant cavity are coupled in parallel to form the M-Z compound external cavity structure.

In some embodiments, a refractive index of a waveguide of any of the passive ring resonant cavity and the FP resonant cavity is adjustable, thus achieving a wavelength tuning function.

In some embodiments, the narrow linewidth laser further includes a second gain region, the second gain region is provided on the outer side of the M-Z compound external cavity structure and is at least used for amplifying lasing light, improving output power, enhancing optical feedback, and further narrowing the linewidth and suppressing the noise.

In some embodiments, the narrow linewidth laser further includes an additional PN junction region or MOS junction region, and the additional PN junction region or MOS junction region is embedded in the M-Z compound external cavity structure.

Further, the additional PN junction region is a gain region (which can be defined as a third gain region at the moment), and is at least used for compensating the loss of the M-Z compound external cavity structure, thus extending an external cavity optical path and narrowing the laser linewidth.

Or, further, the additional PN junction region or MOS junction region is transparent to the lasing light, and a refractive index of the additional PN junction region or MOS junction region can be rapidly adjusted when performing current injection or reverse bias on the additional PN junction region or MOS junction region, thus achieving rapid tuning of the lasing wavelength with low power consumption. Wherein the refractive index of the additional PN junction region or MOS junction region can be rapidly changed by performing current injection or reverse bias on the additional PN junction region or MOS junction region, thus changing an interference condition of a M-Z interferometer, and achieving a broadband rapid tuning function of the laser.

In some embodiments, the laser is of a monolithically integrated configuration.

In some embodiments, the laser configuration includes a heterogeneously integrated configuration, a butt-joint integrated configuration, or a micro-assembled integrated configuration.

In some embodiments, the first gain region is further provided with a grating structure, which forms a distributed feedback (DFB) laser or a distributed Bragg (DBR) laser together with the first gain region.

In some embodiments, the first gain region includes a semiconductor optical amplifier, a DFB laser or a DBR laser.

In some embodiments, the second gain region includes a semiconductor optical amplifier.

In some embodiments, the additional PN junction region includes a semiconductor optical amplifier or a waveguide transparent to the lasing light.

In some embodiments, the additional MOS junction region includes a waveguide transparent to the lasing light.

In some embodiments, an anti-reflection accessory (such as an anti-reflection film) is arranged at a light-emitting end of the laser, and a high-reflection accessory (such as a high-reflection film) is arranged at a non-light-emitting end of the laser.

In some embodiments, the laser configuration includes a heterogeneously integrated configuration, a butt-joint integrated configuration, or a micro-assembled integrated configuration.

In some embodiments, the laser is formed by combining a semiconductor gain chip and the M-Z compound external cavity structure formed by coupling the FP resonant cavity and the passive ring resonant cavity in parallel.

Further, the M-Z compound external cavity structure is a low-loss waveguide structure, and the low-loss waveguide structure includes a waveguide made of the same system of materials which is transparent with respect to a gain material, or a waveguide composed of a material system different from the gain region, or a waveguide made of a mixture of the same system of materials and the different material system, for example, an InP, GaAs-based In(Ga) As(P) waveguide, an InGa(Al) As(P) waveguide, an SOI-based Si waveguide, a SiN waveguide, or a SiNO waveguide, a lithium niobate waveguide, a $SiO_2$ waveguide, a waveguide structure composed of In(Ga)As(P)/Si or $Si/SiO_2$/InGaAsP hybrid waveguide, or the like, but which is not limited thereto.

Further, the M-Z compound external cavity structure is composed of a material which is transparent with respect to the gain region.

Further, any of the gain regions is a gain region with any wavelength lasing.

Further, any of the gain regions includes a semiconductor gain region, an optical fiber gain region, or a solid or gas gain region.

Further, wherein the adopted passive waveguide material is any material which is low loss with respect to the gain region, and any material which is low loss with respect to the gain region includes a transparent semiconductor material, a dielectric material, or a material formed by stacking the semiconductor material and the dielectric material.

A method for fabricating the narrow linewidth laser is provided by some embodiments of the present disclosure, including:
providing a basic semiconductor material structure for forming the laser;
defining an active gain region and a passive waveguide region on the basic semiconductor material structure;
processing on the basic semiconductor material structure to form an active waveguide and passive waveguides, and further to obtain the active gain region and an M-Z compound external cavity structure, wherein, the M-Z compound external cavity structure is formed by the parallel coupling of a passive ring resonant cavity and an FP resonant cavity; and the active gain region includes the active waveguide and is a first gain region;
performing passivation processing on the active waveguide; and
fabricating a P-side electrode and a N-side electrode in match with the basic semiconductor material structure.

In some embodiments, the active gain region (the active waveguide) includes the first gain region, a second gain region and/or a third gain region.

In some embodiments, the fabrication method further includes: defining the active gain region and a compound external cavity region on a substrate, and further acquiring an active gain region material structure and a transparent compound external cavity material structure by a selective epitaxy or quantum well intermixing technology or a butt-joint epitaxy technology, and then further defining the active waveguide and the compound external cavity waveguide by photolithography.

In some embodiments, the fabrication method further includes: depositing a dielectric film on the active waveguide to achieve the passivated active waveguide.

In some embodiments, the fabrication method further includes: fabricating a grating in a waveguide adjacent to the first gain region to form a DFB laser or a DBR laser.

In some embodiments, the fabrication method further includes: further modifying the third gain region to form a PN junction region or a MOS junction region transparent to the lasing wavelength emitted by the first gain region.

In some embodiments, the fabrication method further includes: providing an anti-reflection film and a high-reflectance film at a light-emitting end and a non-light-emitting end of the laser respectively.

Compared with the prior art, the narrow linewidth laser provided by the embodiments of the present disclosure has a simple structure and can achieve broadband tunability, and high side-mode suppression ratio, narrow linewidth, high output power. Moreover, such narrow linewidth laser is simple in tuning mode, rapid in tuning speed, and low in tuning energy consumption.

BRIEF DESCRIPTION OF THE DRAWINGS

To describe the technical solutions in the embodiments of the present disclosure or the prior art more clearly, the following briefly introduces the accompanying drawings required for describing the embodiments or the prior art. Apparently, the accompanying drawings in the following description show merely some embodiments in the present disclosure, and those of ordinary skill in the part may still derive other drawings from theses accompanying drawings without creative efforts.

FIG. 10B is a schematic diagram of a manufacturing process of a monolithically integrated narrow linewidth laser in a specific embodiment of the present disclosure;

FIG. 10C is a diagram of active and passive structures defined through a process in an embodiment of the present disclosure;

FIG. 10D is a diagram of active and passive structures defined through a process in another embodiment of the present disclosure;

DETAILED DESCRIPTION OF THE EMBODIMENTS

The following describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by those of ordinary skill in the art based on the embodiments of the present disclosure without creative efforts shall fall within the scope of protection of the present disclosure.

Figure 1:
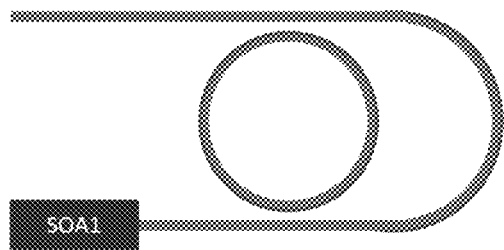
FIG. 1 is a schematic diagram of a structure of a narrow linewidth laser in a first embodiment of the present disclosure.

As shown in FIG. 1, in a first embodiment of the present disclosure, a narrow linewidth laser includes a first gain region SOA1, a passive ring resonant cavity, and an FP resonant cavity, wherein the first gain region is used for providing a gain for the whole laser, and the passive ring resonant cavity and the FP resonant cavity forms an M-Z compound external cavity structure. Further, the M-Z compound external cavity structure may serve as linewidth narrowing, wavelength tuning and frequency selecting units of the laser.

With respect to DFB or DBR lasers, the narrow linewidth laser belongs to external-cavity semiconductor lasers; compared with other external cavity structures, the principle of the narrow linewidth laser is as follows: the passive ring resonant cavity and the FP resonant cavity can provide resonant peaks with different free spectral ranges, thus achieving wavelength selection using vernier effect of the two resonant cavities, and then a wavelength tuning function can be achieved by changing a refractive index of a waveguide of any of the resonant cavities; and an M-Z interferometer structure formed by coupling the passive ring resonant cavity and the FP resonant cavity in parallel can further achieve wavelength selection. These effects are combined to form a wavelength selective reflection mirror, thus acquiring stable lasing output with the improved side-mode-suppression-ratio. Moreover, the ring resonant cavity may also extend an optical path to effectively narrow the linewidth; in addition, the compound waveguide external cavity can further narrow the linewidth by utilizing optical negative feedback effect.

In accordance with the present disclosure, the vernier effect refers to a method to achieve intensity modulated resonance peak of the resonance frequency spectrum in the whole compound cavity by connecting two resonant cavities with different optical lengths in series or in parallel, and further to achieve broadband tuning by changing the refractive index of any of the resonant cavities.

Figure 2:
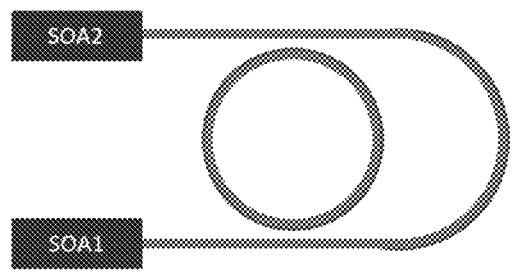
FIG. 2 is a schematic diagram of a structure of a narrow linewidth laser in a second embodiment of the present disclosure.

Further, as shown in FIG. 2, to further improve the device performance, in a second embodiment of the present disclosure, a second gain region SOA2 can also be further integrated at the outer side of the M-Z compound external cavity structure; on one hand, the output power can be improved, and the linewidth can be narrowed and the noise can be suppressed; on the other hand, the feedback strength of the gain region in the laser can be adjusted to achieve narrow linewidth stable output for the laser under strong feedback.

Figure 3:
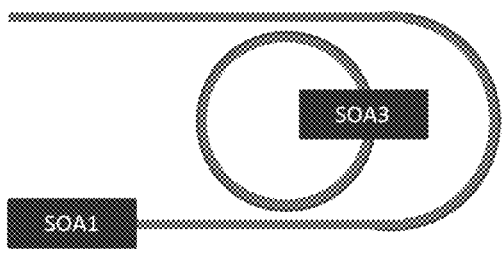
FIG. 3 is a schematic diagram of a structure of a narrow linewidth laser in a third embodiment of the present disclosure.

Further, as shown in FIG. 3, in a third embodiment of the present disclosure, an additional PN junction region can be further embedded in the passive ring resonant cavity; the additional PN junction region is also a gain region, and can be named a third gain region SOA3 for compensating external cavity loss, thus extending an external cavity optical path and enhancing optical negative feedback to effectively narrow the laser linewidth. More specifically, the third gain region is embedded in the passive ring resonant cavity, on one hand, the loss in the ring can be compensated, on the other hand, the refractive index change is introduced through current injection to achieve phase matching of the lasing wavelength of the laser, thus acquiring a high side-mode suppression ratio and narrow linewidth; and the vernier effect caused by the refractive index change can make the lasing wavelength of the laser be rapidly adjustable in a large range.

Figure 4:
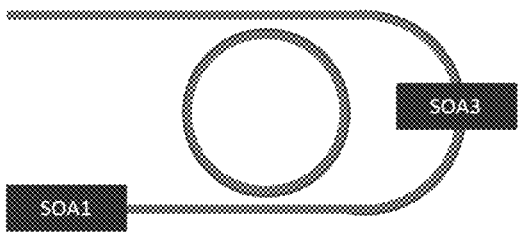
FIG. 4 is a schematic diagram of a structure of a narrow linewidth laser in a fourth embodiment of the present disclosure.

Further, as shown in FIG. 4, in a fourth embodiment of the present disclosure, a third gain region SOA3 can also be embedded in the M-Z compound external cavity structure. On one hand, the third gain region SOA3 is used for compensating the external cavity loss, extending an external cavity optical path, enhancing optical negative feedback and narrowing the laser linewidth; on the other hand, as the third gain region is located on a coherent arm of the M-Z compound external cavity structure, the refractive index of the third gain region can be changed by changing the current injection or reverse bias of the third gain region, thus making the laser achieve rapid tuning based on the vernier effect and the M-Z interference effect, but low-power consumption.

Figure 5:
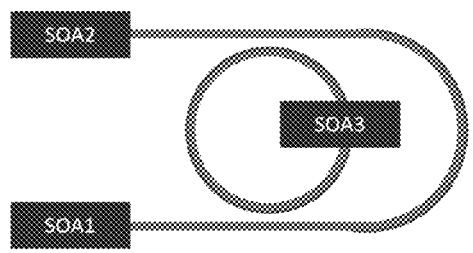
FIG. 5 is a schematic diagram of a structure of a narrow linewidth laser in a fifth embodiment of the present disclosure.

Further, as shown in FIG. 5, in a fifth embodiment of the present disclosure, the first gain region SOA1 and the second gain region SOA2 can be simultaneously integrated on both sides of the FP resonant cavity respectively, and the third gain region SOA3 can be embedded in the passive ring resonant cavity, thus making the laser have the advantages of the first embodiment to the third embodiment.

Figure 6:
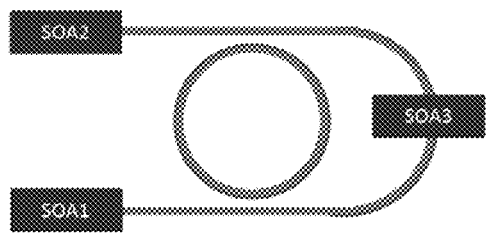
FIG. 6 is a schematic diagram of a structure of a narrow linewidth laser in a sixth embodiment of the present disclosure.

Further, as shown in FIG. 6, in a sixth embodiment of the present disclosure, the first gain region SOA1 and the second gain region SOA2 can be simultaneously integrated on both sides of the FP resonant cavity respectively, and the third gain region SOA3 can be embedded in the M-Z compound external cavity structure, thus making the laser have the advantages of the first embodiment to the third embodiment.

Figure 7:
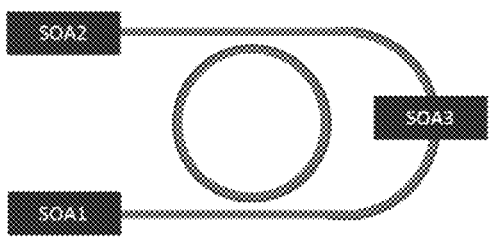
FIG. 7 is a schematic diagram of a structure of a narrow linewidth laser in a seventh embodiment of the present disclosure.

Further, as shown in FIG. 7, in a seventh embodiment of the present disclosure, the first gain region SOA1 and the second gain region SOA2 can be simultaneously integrated on both sides of the FP resonant cavity respectively, and another additional PN junction region SOA3' or MOS junction region can be embedded in the M-Z compound external cavity structure; the additional PN junction region or MOS junction region SOA3' can be formed by performing modification processing or alteration on the third gain region SOA3, or can be formed by depositing a dielectric film and a semiconductor film after removing the third gain region part; the additional PN junction region or MOS junction region SOA3' is transparent to the lasing wavelength of the whole laser; and by performing current injection or reverse bias on the additional PN junction region or MOS junction region SOA3', a laser with broadband rapid tuning, narrow linewidth, and low-power consumption can be achieved, and the tuning quality is improved.

Moreover, for the devices of the fifth embodiment, the sixth embodiment and the seventh embodiment, the laser with narrow-linewidth, broadband tuning, and high-power output can be obtained under electric management.

Figure 8A:
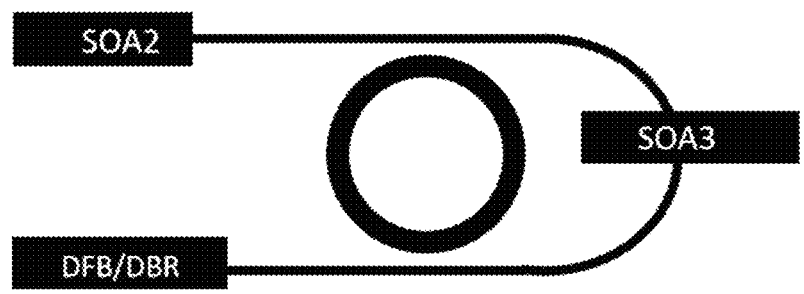
FIG. 8A, FIG. 8B, FIG. 8C, and FIG. 8D are diagrams of a structure of a narrow linewidth laser in an eighth embodiment of the present disclosure.
Figure 8B:
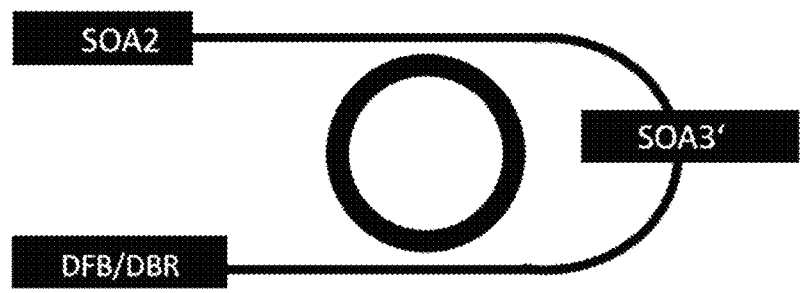

Further, as shown in FIG. 8A and FIG. 8B, in an eighth embodiment of the present disclosure, the DFB or DBR laser and the second gain region SOA2 can be simultaneously integrated on both sides of the FP resonant cavity respectively, and an additional SOA3 (as shown in FIG. 8A) or SOA3' (as shown in FIG. 8B) is embedded in the M-Z compound external cavity structure; the SOA3' is a PN junction region or MOS junction region; the additional PN junction region or MOS junction region SOA3' may be formed by performing modification processing or alteration treatment on the third gain region SOA3, or can be formed by depositing a dielectric film and a semiconductor material after removing the third gain region part; the additional PN junction region or MOS junction region SOA3' is transparent to the lasing wavelength; by performing electric injection or reverse bias on the additional PN junction region or MOS junction region SOA3', rapidly frequency-modulated and narrow linewidth laser with low power consumption can be achieved.

Figure 8C:
Figure 8D:

Further, as shown in FIG. 8C and FIG. 8D, in the eighth embodiment of the present disclosure, the DFB or DBR laser and the second gain region SOA2 can be integrated on the same side of the FP resonant cavity respectively, and an additional SOA3 (as shown in FIG. 8C) or SOA3' (as shown in FIG. 8D) can be embedded in the M-Z compound external cavity structure with a view of achieving high-power narrow linewidth frequency-modulated laser.

Figure 9A:
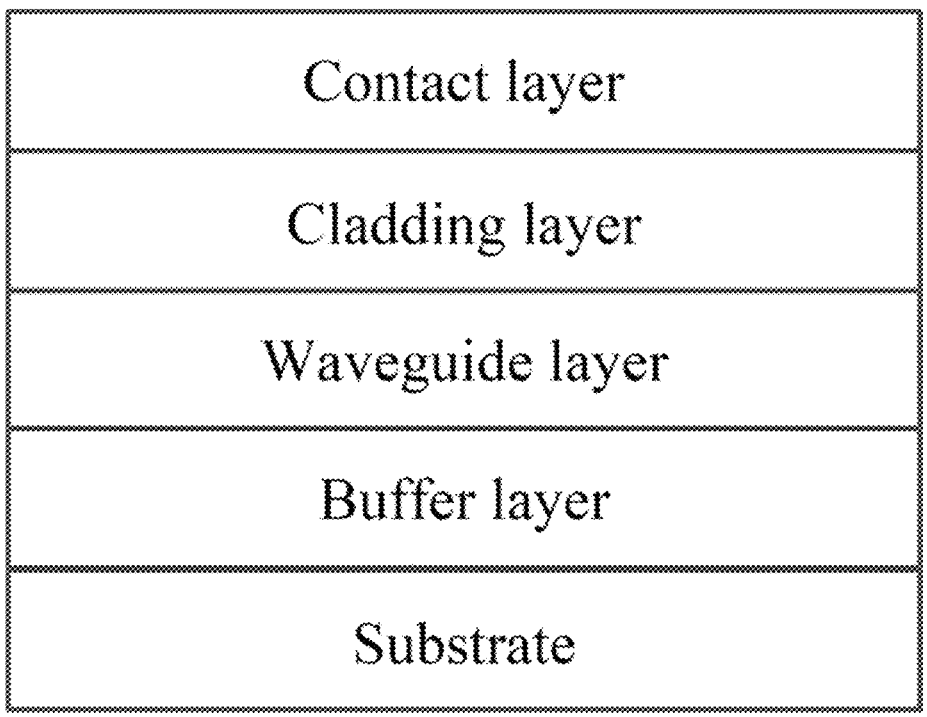
FIG. 9A is a schematic diagram of a material structure of a monolithically integrated narrow linewidth laser in an embodiment of the present disclosure.
Figure 9B:
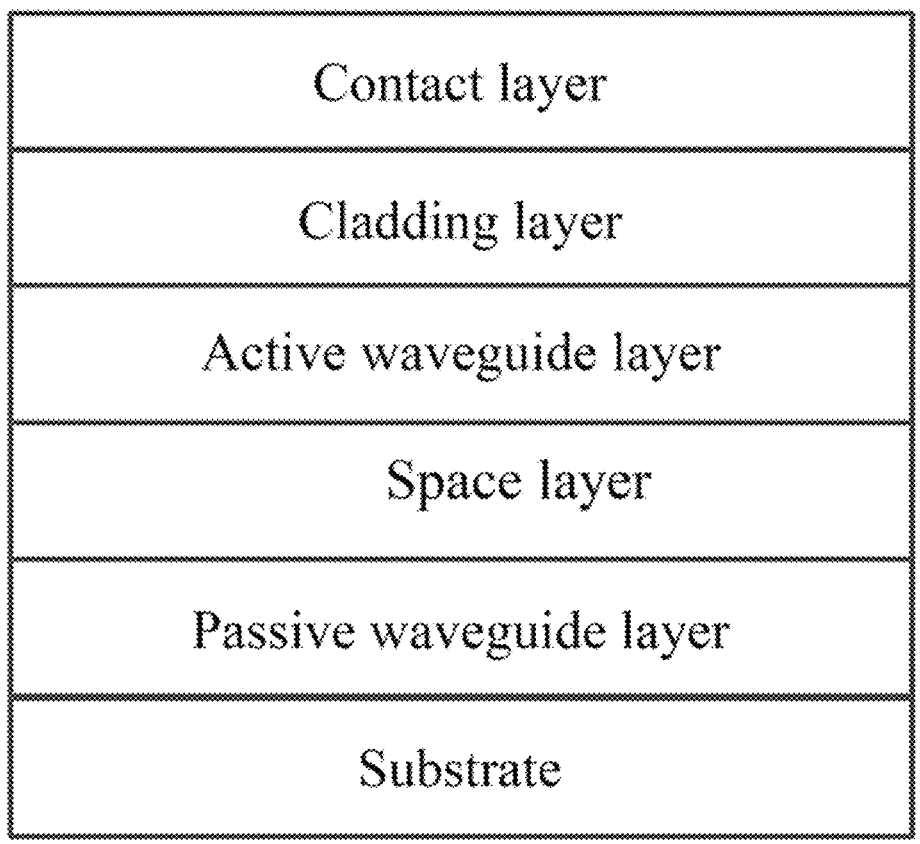
FIG. 9B is a schematic diagram of a material structure of a monolithically integrated narrow linewidth laser in an embodiment of the present disclosure.
Figure 10A:
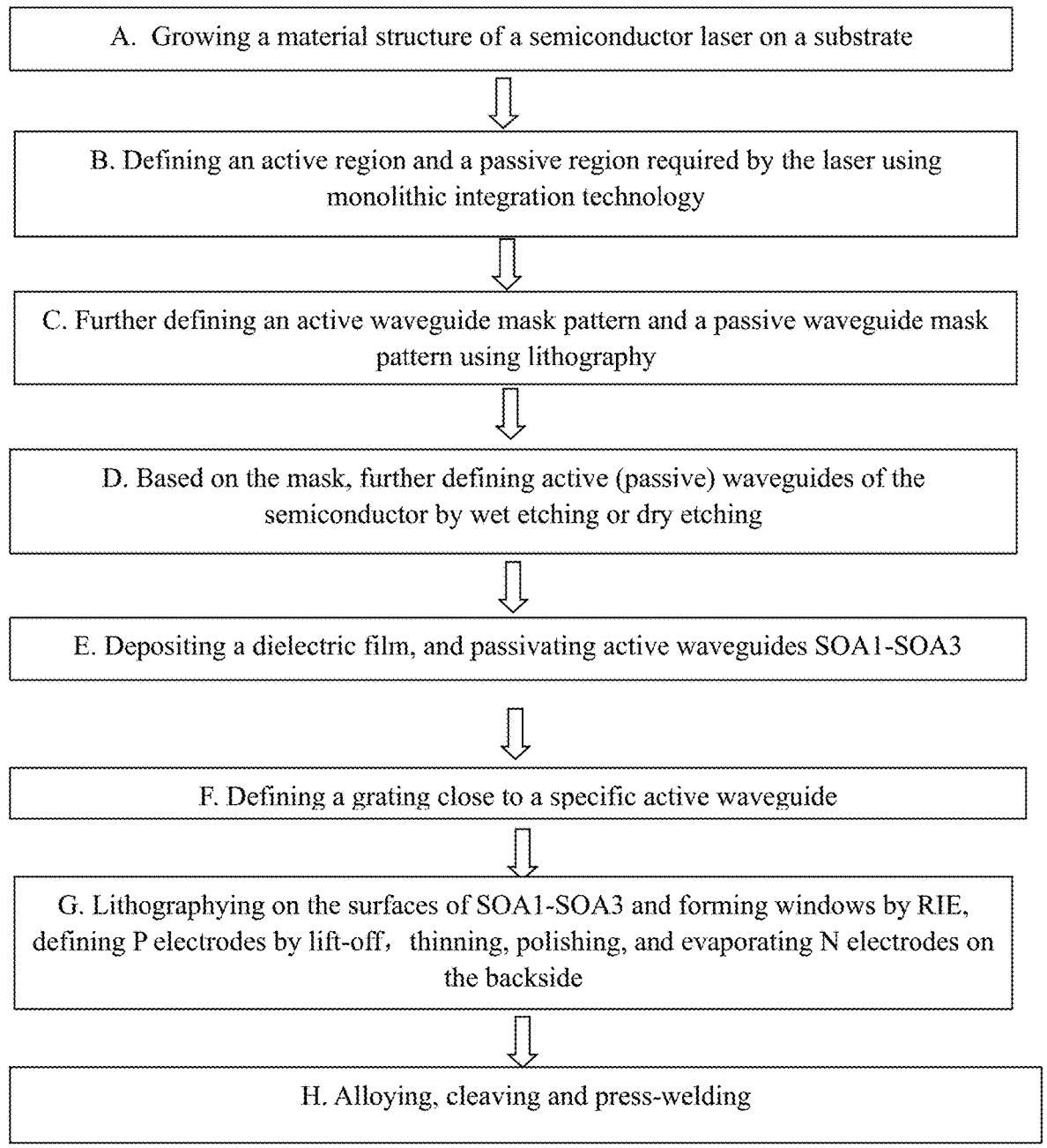
FIG. 10A is a schematic diagram of a manufacturing process of a monolithically integrated narrow linewidth laser in an embodiment of the present disclosure.

The devices of the first embodiment to the eighth embodiment can be achieved based on a semiconductor optoelectronic device substrate and a semiconductor monolithic integration technology or a hybrid integration technology thereon. For example, in some embodiments, as shown in FIG. 10A, the method for fabricating any of the above-mentioned narrow linewidth lasers by the monolithic integration technology may include the following steps:

A. Growing a main semiconductor material structure (e.g., an epitaxial structure) of a laser on a substrate such as GaAs, InP, GaN and the like, as shown in FIG. 9A or FIG. 9B.

B. Defining an active region and a passive region, which are needed by the laser, on the surface of a material structure obtained in the step A using the monolithic integration technology, wherein the monolithic integration technology includes but is not limited to a quantum well intermixing technology, a butt-joint epitaxy technology, a selective area epitaxy technology, and a vertical coupling integration technology.

C. Further defining an active waveguide mask pattern and a passive waveguide mask pattern of the laser according to the laser configuration as shown in FIG. 1 to FIG. 6.

D. Further defining a semiconductor waveguide pattern using wet etching or dry etching based on the above mask to form a semiconductor active waveguide and a semiconductor passive waveguide as shown in FIGS. 10C and 10D, thus defining various gain waveguide structures, and an M-Z compound external cavity waveguide structure formed by coupling a ring resonant cavity and the FP resonant cavity in parallel.

E. After defining all the waveguides, thoroughly removing the etching masks, and then depositing dielectric films such as SiN, $SiO_2$ and the like, and passivating active waveguides SOA1, SOA2, and SOA3.

F. On the basis of the device structure formed in the above step, further fabricating a grating in a gain region part or in an input/output waveguide part with a view to forming a DFB or DBR laser.

G-H. Sequentially performing procedures of opening a dielectric film window, etching the dielectric film, opening an electrode window, depositing a P-side electrode, thinning, polishing, depositing a N-side electrode, alloying, cleaving and the like on all gain regions according to a fabrication process of a conventional semiconductor optoelectronic device, thus completing the process of the corresponding active region part.

For example, in some more specific embodiments, as shown in FIG. 10B, a method for fabricating any of the previous narrow linewidth lasers by the monolithic integration technology may include the following steps:

S1. Growing a main semiconductor material structure (e.g., an epitaxial structure) of a laser on a substrate such as GaAs, InP, GaN and the like, as shown in FIG. 9B. Specifically, a passive waveguide layer, a space layer, an active waveguide layer, a cladding layer, a contact layer and other material structures are grown on the substrate.

S2. Lithographying a basic pattern of a semiconductor laser on the surface of a material structure obtained in the step S1, as shown in FIG. 1-FIG. 6.

S3. Defining an active gain region and a passive waveguide region based on different monolithic integration technologies, wherein the monolithic integration technology includes but is not limited to a vertical coupling technology (specifically a dual-waveguide vertical coupling technology), a quantum well intermixing technology, a butt-joint technology, a selective area epitaxy technology and the like, for example, the whole waveguide of the laser is defined under the mask by dielectric film etching and semiconductor etching.

S4. Taking a dielectric film (e.g. Silicon oxide, silicon nitride and other materials) as an etching mask, sequentially completing definitions of the active waveguide structure and the passive waveguide structure of the laser by semiconductor processing technique such as lithography, dielectric film etching, semiconductor etching and the like, thus forming a semiconductor gain region, and an M-Z compound external cavity waveguide structure formed by coupling a ring resonant cavity and an FP resonant cavity in parallel, and forming active gain region parts SOA1, SOA2, SOA3 and a passive waveguide part, as shown in FIGS. 10C and 10D.

S5. On the basis of the device structure formed in above steps, etching the passive ring cavity and the FP resonant cavity based on the mask, and further fabricating a grating at the gain region SOA1 part or an input/output waveguide part with a view of forming a DFB or DBR laser.

S6. After defining all the waveguides, thoroughly removing the etching masks, and then passivating active waveguides SOA1, SOA2, and SOA3 by depositing dielectric films such as SiN and $SiO_2$.

S7-S8. Sequentially performing procedures of opening a dielectric film window, etching the dielectric film, opening an electrode window, depositing a P-side electrode, thinning, polishing, depositing a N-side electrode, alloying, cleaving and the like on all gain regions according to a fabrication process of a conventional semiconductor optoelectronic device, thus completing the processing of the corresponding active region part.

Further, in the above fabrication method, the procedure of modifying the third gain region SOA3 can also be added to convert the third gain region to be transparent to the lasing light of the device, by which, the electrically injected or reverse biased PN junction or MOS junction can be achieved, and the device configurations shown in FIG. 7 or FIG. 8B or FIG. 8D should be obtained.

Further, on basis of a primary test, an anti-reflection film can be deposited at a light-emitting facet of a fabricated chip to avoid residual reflection, and a high-reflection film can be deposited on one side of a non-light-emitting facet to enhance light feedback, thus narrowing the linewidth and suppressing the noise.

Compared with other chip-level narrow linewidth semiconductor lasers, the narrow linewidth laser provided by the embodiments of the present disclosure is simple in waveguide structure, simple in tuning management, and it is expected to obtain broadband rapidly tuning with low power consumption, high side-mode suppression ratio, and narrow linewidth.

Compared with other technological processes (such as hybrid integration of a semiconductor active region defined on a semiconductor substrate and an M-Z compound external cavity defined on an SOI substrate through a butt-joint coupling), the monolithically integrated narrow linewidth laser formed by the embodiments of the present disclosure at least has the following advantages: ① coupling loss of the external cavity and the gain region can be greatly eliminated, thus effectively reducing a threshold value and narrowing linewidth; ② the same material has similar thermal and mechanical properties, thus the device is good in stability and reliability and has the increased susceptibility to severe environment; ③ the devices are uniform and low cost due to their batch design and fabrication; ④ it is expected to achieve electric tuning, high tuning speed, good tuning linearity, and low tuning power consumption.

Figure 11:
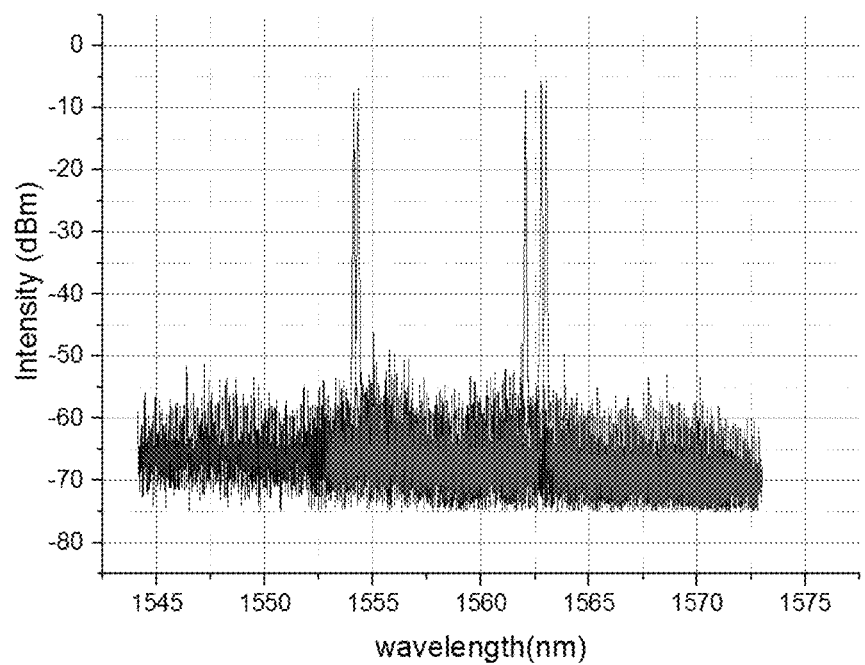
FIG. 11 is a spectrum of a monolithically integrated narrow linewidth laser in an embodiment of the present disclosure.
Figure 12:
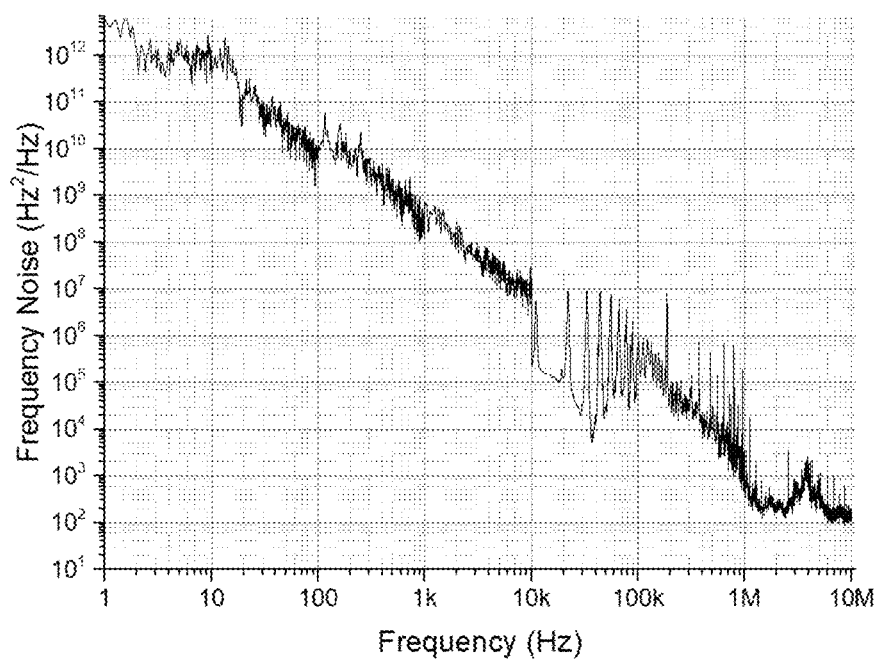
FIG. 12 is a frequency noise spectrum of a monolithically integrated narrow linewidth laser in an embodiment of the present disclosure.

FIG. 11 is a spectrum of a laser in an embodiment as shown in FIG. 3. It can be known that the laser has a high side-mode suppression ratio and broadband tuning function. FIG. 12 is a frequency noise spectrum of the laser, and based on the noise level at 10 MHz frequency section of this frequency noise spectrum, it can be extracted that the laser has a Lorentzian linewidth of the order of kHz level.

In some other embodiments, for the lasers of the first and second embodiments, the device can also be achieved through butt-joint integration, optical micro-assembling and other technical solutions, while the basic configuration of the device is to be presented as a semiconductor gain chip and an M-Z compound external cavity structure formed by coupling the FP resonant cavity and the ring resonant cavity, wherein the gain chip of the device can be any gain unit with required wavelengths, which includes but is not limited to semiconductor gain chips with various substrates and wavelength ranges, an optical fiber gain unit, a solid (gas) gain unit and the like; the M-Z compound external cavity can be In(AlGa)As(P) waveguide, SOI waveguide, Si waveguide, SiN waveguide, SiNO waveguide and any other waveguide structure which is transparent and low loss with respect to the gain units, thus guaranteeing that the broadband tunable narrow linewidth laser can be achieved; wherein the gain region SOA1 part may select a semiconductor optical amplifier, a DFB laser or a DBR laser; and SOA2 and SOA3 generally take the gain region as the semiconductor optical amplifier. In some cases, the SOA3 can also be replaced with the previous SOA3', i.e., the PN junction or MOS junction.

It should be noted that the relationship terminologies such as first, second and the like are only used herein to distinguish one entity or operation from another, rather than to necessitate or imply that the actual relationship or order exists between the entities or operations. Furthermore, terms of "include", "comprise" or any other variants are intended to be non-exclusive. Therefore, a processor, method, article or apparatus including a series of elements includes not only the elements but also other elements inherent for the process, method, article of apparatus Unless expressively limited otherwise, the statement "comprising (including) one." does not exclude the case that other similar elements may exist in the process, method, article or apparatus.

The above is the preferred implementation mode of the present disclosure. It should be noted that a plurality of improvements and modifications made by those of ordinary skill in the art without departing from the principle of the present disclosure shall fall within the scope of protection of the present disclosure.

What is claimed is:

1. A narrow linewidth laser, comprising a passive ring resonant cavity, an FP resonant cavity, and a first gain region, wherein the passive ring resonant cavity and the FP resonant cavity are combined to form an M-Z compound external cavity structure such that the FP resonant cavity has a U-shape that envelops a side of a ring structure of said passive ring resonant cavity, wherein the U-shape is disposed in a same plane as a ring shape of said ring structure; the M-Z compound external cavity structure is at least used for providing wavelength selection and narrowing a laser linewidth; and the first gain region is provided on an outer side of the M-Z compound external cavity structure and is at least used for providing a gain for the whole laser.

2. The narrow linewidth laser according to claim 1, wherein the passive ring resonant cavity and the FP resonant cavity are coupled in parallel to form the M-Z compound external cavity structure; and/or a refractive index of a waveguide of any one of the passive ring resonant cavity and the FP resonant cavity is adjustable, thus achieving a wavelength tuning function.

3. The narrow linewidth laser according to claim 1, further comprising a second gain region, wherein the second gain region is provided on the outer side of the M-Z compound external cavity structure and is at least used for amplifying a lasing light, improving output power, enhancing optical feedback, and further narrowing the laser linewidth and suppressing noise.

4. The narrow linewidth laser according to claim 3, wherein the laser is of a monolithically integrated configuration, wherein the first gain region is further provided with a grating structure, wherein the grating structure forms a distributed feedback (DFB) laser or a distributed Bragg (DBR) laser together with the first gain region; the second gain region comprises a semiconductor optical amplifier; a laser configuration comprises a heterogeneously integrated configuration, a butt-joint integrated configuration or a micro-assembled integrated configuration; in all these configurations, the first gain region comprises a semiconductor optical amplifier or a DFB laser or a DBR laser, and the second gain region comprises a semiconductor optical amplifier.

5. The narrow linewidth laser according to claim 4, wherein the laser is of a monolithically integrated configuration, wherein monolithic integration of the monolithically integrated configuration is achieved through any one of technologies of quantum well intermixing, butt-joint epitaxy, selective area epitaxy and vertical coupling integration.

6. The narrow linewidth laser according to claim 1, further comprises an additional PN junction region or MOS junction region, wherein the additional PN junction region or MOS junction region is embedded in the M-Z compound external cavity structure; the additional PN junction region is a gain region and is at least used for compensating a loss of the M-Z compound external cavity structure, thus extending an external cavity optical path, enhancing optical negative feedback and narrowing the laser linewidth; or, the additional PN junction region or MOS junction region is transparent to a lasing wavelength, and a refractive index of the additional PN junction region or MOS junction region is allowed to be rapidly adjusted when performing electrical injection or reverse bias on the additional PN junction region or the MOS junction region, thus achieving rapid tuning of the lasing wavelength with lower power consumption.

7. The narrow linewidth laser according to claim 6, wherein the laser is a monolithically integrated configuration, and the first gain region is further provided with a grating structure, wherein the grating structure forms a distributed feedback (DFB) laser or a distributed Bragg (DBR) laser together with the first gain region; the second gain region comprises a semiconductor optical amplifier; the additional PN junction region comprises a semiconductor optical amplifier or a waveguide transparent to a lasing light; the additional MOS junction region comprises a waveguide transparent to the lasing wavelength; a laser configuration comprises a heterogeneously integrated configuration, a butt-joint integrated configuration or a micro-assembled integrated configuration; in all these configurations, the first gain region comprises a semiconductor optical amplifier or the DFB laser or the DBR laser, the second gain region comprises the semiconductor optical amplifier, the additional PN junction region comprises the semiconductor optical amplifier or the waveguide transparent to the lasing light, or the additional MOS junction region is a waveguide transparent to the lasing light.

8. The narrow linewidth laser according to claim 4, wherein the laser is formed by combining a semiconductor gain chip and the M-Z compound external cavity structure formed by coupling the FP resonant cavity and the passive ring resonant cavity in parallel.

9. The narrow linewidth laser according to claim 8, wherein the M-Z compound external cavity structure is a low-loss waveguide structure, the low-loss waveguide structure comprises a waveguide made of a same system of materials transparent with respect to a gain material, or a waveguide composed of a material system different from the gain region, or a waveguide made of a mixture of the same system of materials and a different material system, said waveguide being an InP, GaAs-based In(Ga)As(P) waveguide, an InGa(Al)As(P) waveguide, an SOI-based Si waveguide, an SiN waveguide, a lithium niobate waveguide, an SiNO waveguide, an $SiO_2$ waveguide, or an In(Ga)As(P)/Si or $Si/SiO_2$/InGaAsP hybrid waveguide.

10. The narrow linewidth laser according to claim 3, wherein any of the gain regions is a gain region with any wavelength lasing; and/or any of the gain regions comprises a semiconductor gain region, an optical fiber gain region, or a solid or gas gain region; and/or an adopted passive waveguide material is any material having low loss with respect to the gain region, wherein any material having low loss with respect to the gain region comprises a transparent semiconductor material, a dielectric material, or a material formed by stacking the semiconductor material and the dielectric material; and/or an anti-reflection accessory is arranged at a light-emitting end of the laser, and a high-reflection accessory is arranged at a non-light-emitting end of the laser.

11. The narrow linewidth laser according to claim 2, wherein the laser is of a monolithically integrated configuration, wherein the first gain region is further provided with a grating structure, wherein the grating structure forms a distributed feedback (DFB) laser or a distributed Bragg (DBR) laser together with the first gain region; the second gain region comprises a semiconductor optical amplifier; a laser configuration comprises a heterogeneously integrated configuration, a butt-joint integrated configuration or a micro-assembled integrated configuration; in all these configurations, the first gain region comprises a semiconductor optical amplifier or a DFB laser or a DBR laser, and the second gain region comprises a semiconductor optical amplifier.

12. The narrow linewidth laser according to claim 3, wherein the laser is of a monolithically integrated configuration, wherein the first gain region is further provided with a grating structure, wherein the grating structure forms a distributed feedback (DFB) laser or a distributed Bragg (DBR) laser together with the first gain region; the second gain region comprises a semiconductor optical amplifier; a laser configuration comprises a heterogeneously integrated configuration, a butt-joint integrated configuration or a micro-assembled integrated configuration; in all these configurations, the first gain region comprises a semiconductor optical amplifier or a DFB laser or a DBR laser, and the second gain region comprises a semiconductor optical amplifier.

13. The narrow linewidth laser according to claim 2, further comprises an additional PN junction region or MOS junction region, wherein the additional PN junction region or MOS junction region is embedded in the M-Z compound external cavity structure; the additional PN junction region is a gain region and is at least used for compensating a loss of the M-Z compound external cavity structure, thus extending an external cavity optical path, enhancing optical negative feedback and narrowing the laser linewidth; or, the additional PN junction region or MOS junction region is transparent to a lasing wavelength, and a refractive index of the additional PN junction region or MOS junction region is allowed to be rapidly adjusted when performing electrical injection or reverse bias on the additional PN junction region or the MOS junction region, thus achieving rapid tuning of the lasing wavelength with lower power consumption.

14. The narrow linewidth laser according to claim 3, further comprises an additional PN junction region or MOS junction region, wherein the additional PN junction region or MOS junction region is embedded in the M-Z compound external cavity structure; the additional PN junction region is a gain region and is at least used for compensating a loss of the M-Z compound external cavity structure, thus extending an external cavity optical path, enhancing optical negative feedback and narrowing the laser linewidth; or, the additional PN junction region or MOS junction region is transparent to a lasing wavelength, and a refractive index of the additional PN junction region or MOS junction region is allowed to be rapidly adjusted when performing electrical injection or reverse bias on the additional PN junction region or the MOS junction region, thus achieving rapid tuning of the lasing wavelength with lower power consumption.

15. The narrow linewidth laser according to claim 2, wherein any of the gain regions is a gain region with any wavelength lasing; and/or any of the gain regions comprises a semiconductor gain region, an optical fiber gain region, or a solid or gas gain region; and/or an adopted passive waveguide material is any material having low loss with respect to the gain region, wherein any material having low loss with respect to the gain region comprises a transparent semiconductor material, a dielectric material, or a material formed by stacking the semiconductor material and the dielectric material; and/or an anti-reflection accessory is arranged at a light-emitting end of the laser, and a high-reflection accessory is arranged at a non-light-emitting end of the laser.

16. The narrow linewidth laser according to claim 3, wherein any of the gain regions is a gain region with any wavelength lasing; and/or any of the gain regions comprises a semiconductor gain region, an optical fiber gain region, or a solid or gas gain region; and/or an adopted passive waveguide material is any material having low loss with respect to the gain region, wherein any material having low loss with respect to the gain region comprises a transparent semiconductor material, a dielectric material, or a material formed by stacking the semiconductor material and the dielectric material; and/or an anti-reflection accessory is arranged at a light-emitting end of the laser, and a high-reflection accessory is arranged at a non-light-emitting end of the laser.

17. The narrow linewidth laser according to claim 7, wherein any of the gain regions is a gain region with any wavelength lasing; and/or any of the gain regions comprises a semiconductor gain region, an optical fiber gain region, or a solid or gas gain region; and/or an adopted passive waveguide material is any material having low loss with respect to the gain region, wherein any material having low loss with respect to the gain region comprises a transparent semiconductor material, a dielectric material, or a material formed by stacking the semiconductor material and the dielectric material; and/or an anti-reflection accessory is arranged at a light-emitting end of the laser, and a high-reflection accessory is arranged at a non-light-emitting end of the laser.

\* \* \* \* \*